Figure 1:
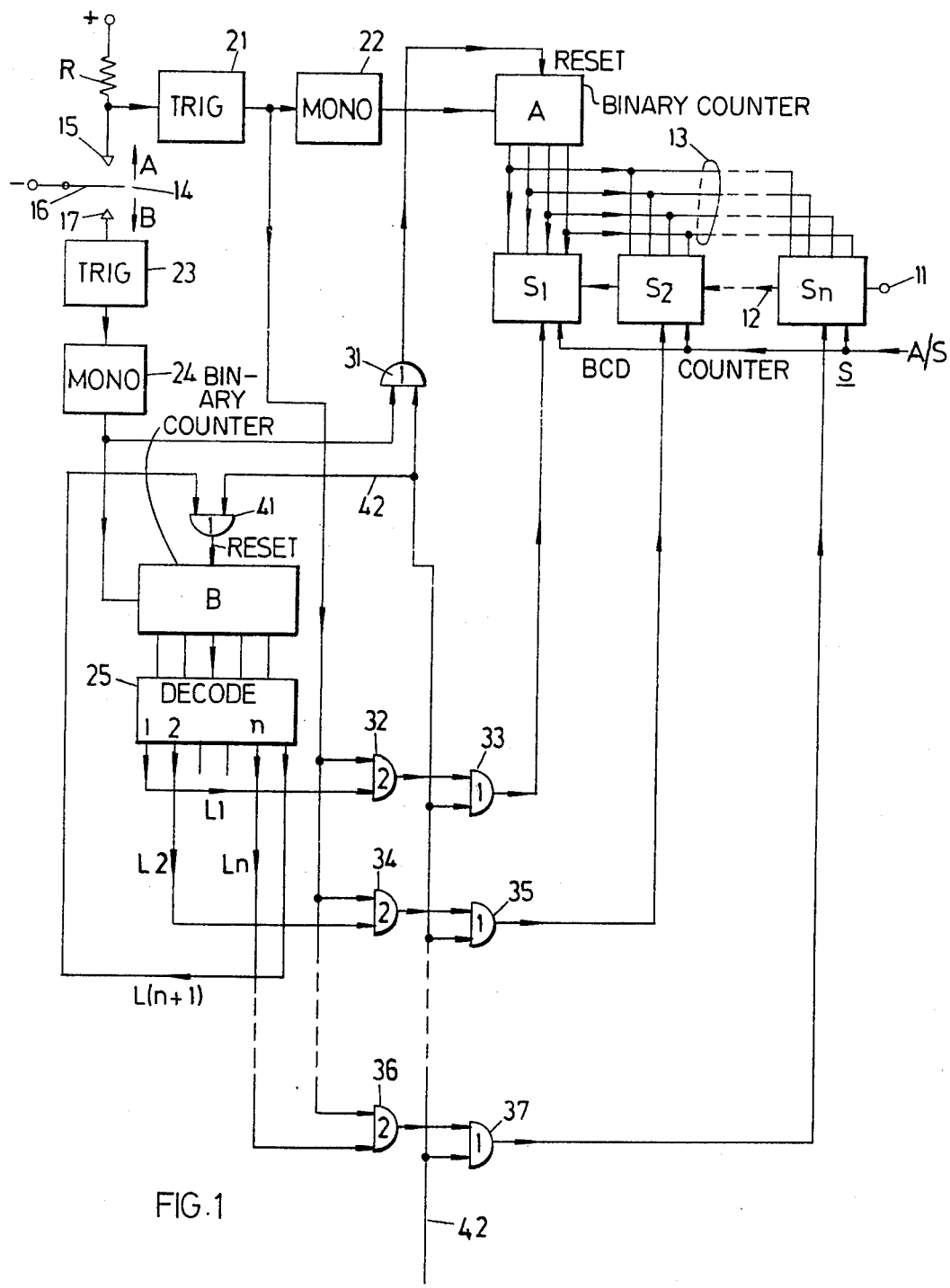

United States Patent [19]
Christie et al.

[11] 3,976,859
[45] Aug. 24, 1976

[54] PRESETTABLE MULTI-STAGE BINARY-CODED DECIMAL COUNTERS

[75] Inventors: Stuart Melville Christie, Midlothian; Alexander Turnbull Shepherd, Edinburgh, both of Scotland

[73] Assignee: Ferranti Limited, Hollinwood, England

[22] Filed: Feb. 26, 1975

[21] Appl. No.: 553,287

[30] Foreign Application Priority Data
Mar. 6, 1974 United Kingdom............... 10150/74

[52] U.S. Cl.................... 235/92 PE; 235/92 CC; 235/92 R
[51] Int. Cl.²........................................ H03K 21/36
[58] Field of Search....... 235/92 PE, 92 CC, 92 DE, 235/92 EV

[56] References Cited
UNITED STATES PATENTS

| | | | |
|---|---|---|---|
| 3,272,970 | 9/1966 | Laycak et al. ................. | 235/92 PE |
| 3,413,452 | 11/1968 | Schlein........................... | 235/92 PE |
| 3,705,296 | 12/1972 | Kochi............................. | 235/92 CC |
| 3,813,525 | 5/1974 | Kitterman et al. .............. | 235/92 PE |
| 3,863,224 | 1/1975 | Alexander...................... | 235/92 PE |

*Primary Examiner*—Gareth D. Shaw
*Assistant Examiner*—John P. Vandenburg
*Attorney, Agent, or Firm*—Cameron, Kerkam, Sutton, Stowell & Stowell

[57] ABSTRACT

A multiple-stage binary-coded decimal counter comprises a number of stages each having four preset data input points capable of being energized in parallel binary fashion. A presetting counter is provided, arranged to supply to the preset data input points binary signals representing a decimal digit. The presetting counter is itself actuated by an abrupt signal, and means are provided for selecting the counter stages one at a time for setting from the presetting counter. This last-mentioned means is inhibited except during the presetting procedure.

8 Claims, 2 Drawing Figures

PRESETTABLE MULTI-STAGE BINARY-CODED DECIMAL COUNTERS

This invention relates to multi-stage binary-coded decimal (BCD) counters of the type in which each stage is provided with four input points capable of being energised in parallel binary fashion by some outside source to allow the stage to be preset with data to represent any of the decimal digits 0 to 9 inclusive.

For presetting a number in such a counter, it is known to provide each stage with a digit switch in the form of a dialling system or ten-way rotary selector capable of being operated to represent a particular decimal digit required to be preset in that stage and followed by some form of decoder to deliver the digit in binary-coded form to the four input point of the stage.

As that equipment must be provided for each stage individually much panel space is needed and considerable cost involved where the number of counter stages is appreciable. Furthermore, with the large number of contacts thus required, the risk of misoperation due to contact faults furnishes another disadvantage of such an arrangement.

An object of the invention is to provide a BCD counter of the type stated having new and useful apparatus for presetting a number in it.

A particular object is to provide such a counter with presetting apparatus that is substantially less both in bulk and cost than presetting apparatus as hitherto disclosed.

In accordance with the present invention, a multi-stage binary-coded decimal counter of the type in which each stage is provided with four preset data input points capable of being energised in parallel binary fashion, which counter includes a presetting counter arranged to supply to the preset data input points of all stages of the binary-coded decimal counter at any given moment binary signals representing a decimal digit in terms of the number held in the presetting counter at that moment, means for actuating the presetting counter at will by an abrupt signal, stage-selecting means operable for selectively enabling each of said stages one at a time to allow it to respond to the said binary signals and so represent a decimal digit, and arrangements for inhibiting the enabling action of the stage-selecting means except during the procedure for actuating the presetting counter.

The means for actuating both the presetting counter and the stage-selecting means may be a single two-way switch or two one-way switches.

The arrangements for inhibiting the enabling action of the stage-selecting means may be such as in operation remove the inhibition before the initiation of the abrupt signal and re-impose the inhibition after the response of the presetting counter to that signal.

Arrangements may be provided whereby the operation of the stage-selecting means restores the said presetting counter to a datum number, such as zero.

Where the counter is of the kind in which the pulses to be counted are unidirectional and their sense — that is, whether they are for addition or subtraction — is controllable by the bias of a control lead common to all stages of the counter and a pulse-sense signal is available to represent the sense of each pulse on its arrival, there may be provided a display device for displaying the sign of the count held in the counter, a bistable stage to control the display device, a detect-zero stage responsive only when all stages of the counter hold digit zero, and a logic network responsive to signals indicating the sense of each pulse to be counted and to the output of the detect-zero stage to control a level applied to the common control lead and the bistable stage.

The apparatus as set forth in the preceding paragraph may be further provided with arrangements to enable the operator to define and cause to be displayed the signal of the count as preset in the counter and for setting up the appropriate value of the said control lead bias, such arrangements including means for deriving from the stage-selecting means a further signal after all the counter stages have been enabled, connections for deriving from a stage or stages of the presetting counter a sign-indicating signal to represent the sign of the preset count, and means for applying the further signal and the sign-indicating signal to at least a part of the logic network so as to actuate the display device to display the appropriate signal and bias the common control lead in accordance with that signal in which case arrangements may be provided for inhibiting the application of the further signal to the logic network except during the application of the sign-indicating signal to the logic network.

Figure 2:
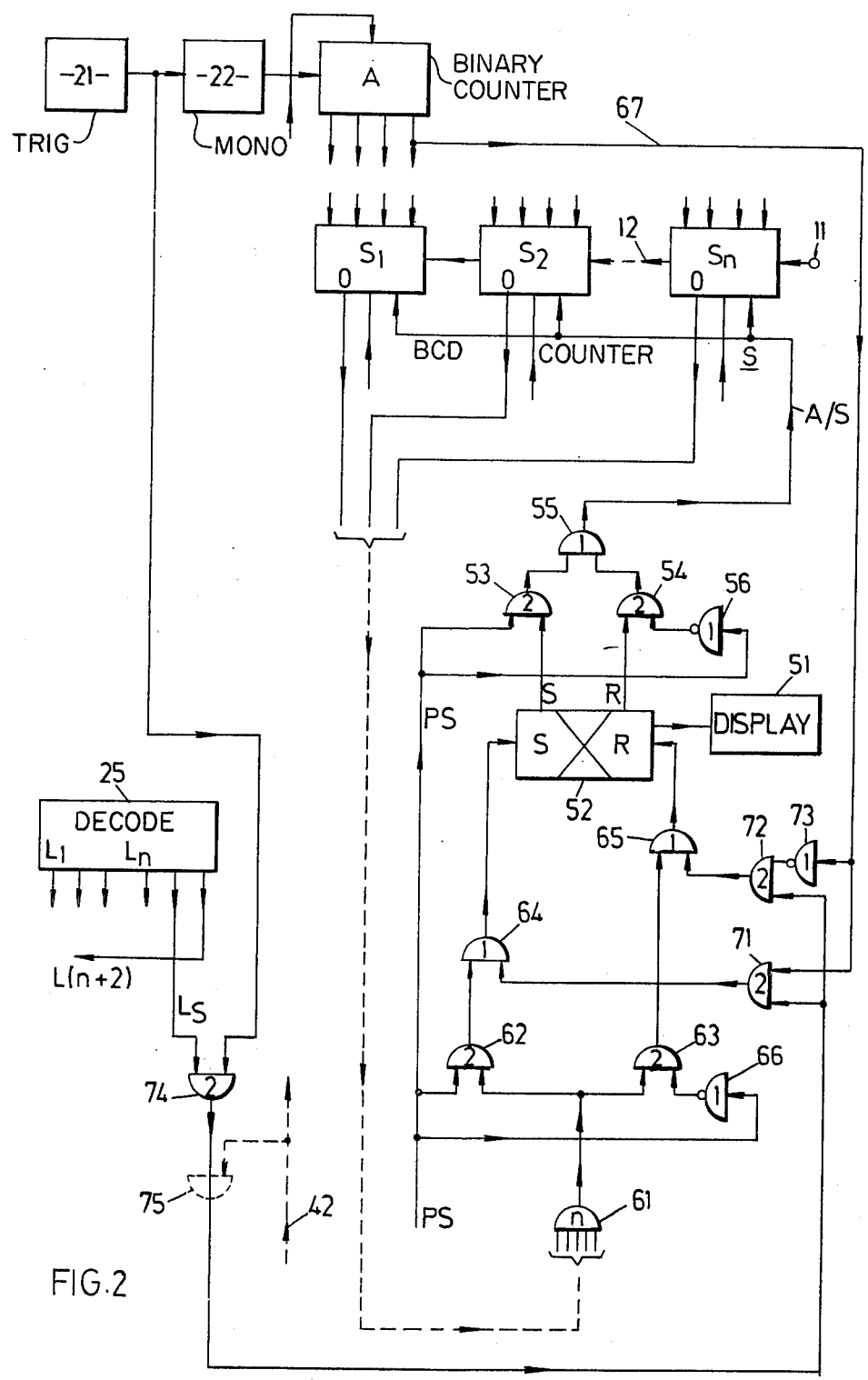

In the accompanying drawings:

FIG. 1 is a diagram in somewhat simplified block form of one embodiment of the invention, and FIG. 2 shows additional equipment within the invention for the embodiment of FIG. 1.

In carrying out the invention in accordance with that form by way of example, an $n$ stage BCD counter S of the type stated includes the counter itself having stages S1, S2 ... S$n$, in decreasing order of significance. Only those three stages are shown for clarity. Each stage is provided with some means, not shown, for displaying the number it holds.

The main (as opposed to the presetting) input to the counter is by way of a terminal 11 of the stage S$n$ of least significance, the leads for the interstage carriers being indicated at 12. The Add and Subtract counting direction is controlled by the bias of a lead A/S common to all the S stages.

The presetting input is provided by a presetting four-bit binary counter A which is common to all stages. It is arranged to act as a single-stage BCD counter by internal connections which curtail its full sequence to the range 0 to 9. The connections from it to deliver the BCD signals (representing also the number held in counter A) to the preset input points of the S stages are in the form of four leads 13.

The source of actuating the counter A includes a single pole changeover switch 14. One of the fixed contacts 15 is connected to counter A whilst the movable contact 16 is connected to a source of negative potential.

The connection from contact 15 to the counter A is by way of a Schmitt trigger stage 21, the input to which is also connected by way of a resistor R to a source of positive potential, and a delay stage in the form of a monostable stage 22.

Stage 21 is used to derive from the closure of contacts 15 and 16 a signal of rectangular waveform with a leading edge abrupt enough to trigger stage 22 to its unstable state. Counter A is actuated by the trailing edge of the rectangular output from stage 22 at the end of its unstable stage, which occurs before the end of the rectangular signal from stage 21.

To select the stage of the main counter which is to receive a presetting signal, the other fixed contact 17 of switch 14 is connected by way of another Schmitt trigger stage 23, and monostable stage 24 to actuate another binary counter B. The output from that counter is applied to a decoder 25, the counter having sufficient bit capacity to enable the decoder to energise $(n + 1)$ output leads L1, L2 ... L$(n + 1)$ one at a time, and one only at any one time, in response to $(n + 1)$ signals keyed into counter 25 by switch 14. In response to each of the first $n$ signals the decoder changes the energisation to its next output lead and maintains it energised until the next signal arrives at counter B, or until the counter is reset.

Trigger stage 23 acts similarly to stage 21 to provide a rectangular signal the leading edge of which is abrupt enough to trigger state 24 to its unstable stage; the signal to step counter B, delayed as is the A signal by stage 22 as described above, is derived from the trailing edge of stage 24's unstable state. The output pulse from stage 24 is also applied by way of an OR gate 31 to the reset terminal of counter A.

The first output lead L1 from decoder 25 is connected as one input to a two-entry AND gate 32. The output from the gate is applied by way of an OR gate 33 to a point in stage S1 which, when energised, enables the stage to respond to a BCD signal over the four leads 13 from counter A and so acquire the decimal digit which happens to be represented by the condition of energisation of those four leads at that moment.

Lead L2 from the decoder is connected by way of an AND gate 34 and OR gate 35 to the enabling input point of stage S2. Similarly with the leads from the decoder to stages S3 to S$(n - 1)$, none of which are shown. Lead L$n$ is connected and by way of AND and OR gates 36 and 37 to stage S$N$.

The other inputs to AND gates 32, 34, 36 and to the corresponding gates (not shown) for leads L3 to L$(n - 1)$ are provided by the rectangular signal from trigger 21, the arrangement serving to inhibit the enabling action of the stage-selecting apparatus B and 25 except during the procedure for actuating counter A.

Line L$(n + 1)$ from the decoder is applied by way of an OR gate 41 to the reset input point of counter B.

A second input to all the OR gates— namely, 31, 33, 35, 37, 41 and those (not shown) for leads L3 to L$(n - 1)$ is supplied by a common reset lead 42 arranged for manual energisation.

The operation is as follows. For convenience of description switch 14 will be said to be operated in the A or B direction according as the resulting signal is applied to one or other of the counters so labelled.

At the start, a reset signal is applied over lead 42. By way of OR gates 31 and 41, this resets counters A and B to zero.

By way of the remaining OR gates, the reset signal simultaneously enables all the stages of the main counter S; as this allows them to acquire the number represented by the condition of counter A and as that counter has just been zeroised by the same reset signal, they all acquire a zero condition too.

To preset an $n$ power number in counter S, a start is made with its stage S1, which is desirably the most significant stage as already mentioned.

As the initial resetting operation has left counter B holding zero, and the all-zero state of decoder 25 is that which causes energisation of lead L1, stage S1 is already selected. The first operation, therefore, is to actuate switch 14 in the A direction and retain it with contact 15 engaged.

The result of this operation is to initiate from stage 21 an output signal of rectangular waveform the leading edge of which triggers monostable 22 to its unstable state. The signal also removes the inhibition on the enabling means by opening gate 32; this allows the signal which is waiting on lead L1 to reach stage S1 and enable it to acquire the number held by counter A. As that counter and stage S1 already hold zero — for the actuation of the counter is as yet delayed by the unstable state or stage 22 — there is no result.

Shortly afterwards, whilst the rectangular signal from stage 21 is still withholding the inhibition, stage 22 reverts to its stable state; the resulting abrupt signal causing counter A to be stepped to digit 1. The binary number 0001 now held in counter A is acquired as decimal digit 1 by the alerted stage S1.

On observing the display of digit 1 by stage S1, the operator releases switch A, thus ending the rectangular signal from stage 21 and re-imposing the inhibition on the enabling means by closing gate 32.

It will be seen that the delay imposed by the unstable state of monostable 22 on the actuation of counter A allows the inhibition on the stage-selecting means B and 25 to be removed before counter A has responded to the trailing edge. This allows the selected S stage to acquire the number previously held in counter A and, almost immediately afterwards, the number to which the actuation steps it.

Switch 14 is operated again in the A direction. As before, gate 32 is opened to let the signal on lead L1 enable stage S1; at the end of the unstable state of stage 22, counter A is stepped by the resulting abrupt signal to binary number 0010, which value is acquired as decimal digit 2 by stage S1.

Though a signal representing the binary number held in counter A is simultaneously applied over the four leads 13 to all the other S stages, none of them responds, since the decoder 25 has so far enabled only stage S1.

Further operations of switch 14 in the A direction are carried out until stage S1 has acquired the desired decimal digit.

Where the required digit is zero, switch 14 is operated twice in succession in the B direction to skip the S stage concerned and so leaving it holding the zero to which it was reset at the start of operations.

Next it is the turn of stage S2 (assuming it is not one of those to be skipped). To select it, a single operation of switch 14 is made in the B direction. The resulting signal received by counter B causes the decoder to energise lead L2 rather than L1.

A further effect of that operation is again to apply the output from monostable stage 24, acting by way of OR gate 31, to the reset point of counter A. This time, however, the signal is effective as the counter is now holding zero.

The above procedure is repeated until all $n$ stages have been preset to the desired numbers.

A further signal into counter B from switch 14 steps decoder 25 to its last conducting lead L$(n + 1)$, and so delivers a resetting signal to counter B by way of gate 41. (This last facility may not be needed, since counter B is among the stages which are namually reset over lead 42 at the start of operations).

Once all S stages have been preset, the counter is ready to receive at terminal 11 the pulses which it is designed to count.

Schmitt trigger stage 21, by responding only when the switching waveform falls below a predetermined value and restoring when the level rises again beyond that value as the operator releases the switch, provides a clean rectangular wave free from the effects of contact bounce and with a fast leading edge suitable for triggering the monostable stage 22.

Monostable 22, being a retriggerable stage, protects against the occurrence of a grossly imperfect contact which may undesirably succeed in restoring stage 21 momentarily. It also provides by the trailing edge of its monostable stage a signal which is abrupt enough to actuate counter A and which lies well within the rectangular signal from stage 21 which removes the inhibition from the stage-selecting means. Because of this timing, the new value of the count in counter A is recorded in the selected stage of the main counter and displayed.

The inhibiting control exerted by trigger 21 on the application of the enabling signals from decoder 25 to the counter is desirable because if it were not provided and the decoder were left energising one of the enabling leads, the continued presence of an enabling signal at the associated stage which would result would prevent that stage from responding to the pulses to be counted.

The sharing of counters A and B among all the S stages results in a considerable economy of equipment compared with the prior art where presetting equipment individual to each S stage has to be provided.

A convenient method of displaying the sign of the number held in the main counter S will now be described. It is assumed that the counter, in addition to being of the kind having a single input for the pulses to be counted and with the Add/Subtracting (A/S) control exercised over a separate lead as described above, is also of the non-complementary reversible kind— that is, the kind which indicates only the numerical value of the count and requires additional apparatus, usually including a bistable stage, to indicate the sign.

For convenience in the following description pulses may sometimes be referred to as of positive or negative sense, depending on whether, when the count is positive, they would be added to or subtracted from it. From what has just been said, however, it will be appreciated that the pulses are always of uniform sense, their treatment by the counter being determined by the bias on the A/S lead.

With such a counter, arrangements have to be made to maintain the (A/S) control lead correctly biased at each pulse and the correct sign of the total count displayed whenever the counter is stepped through a zero total by a train of unidirectional pulses.

Suppose for example that when the count is positive with the "+" sign displayed a train of negative pulses — that is, all to be subtracted — arrives, the A/S line being accordingly found in its subtract state as each pulse reaches the counter. If such pulses continue to arrive after zero has been reached, they must be added by the counter with the negative sign "−" displayed. In addition to changing the displayed sign, therefore, the bias of the A/S line must be changed to its Add state.

The converse applies when a negative count is stepped down through zero by a train of pulses to be added.

Further, in the circuit of the invention, it is also necessary to provide arrangements for indicating the sign of the number preset into counter S from counter A and ensuring that, as each pulse arrives, the A/S lead has the bias appropriate to that sign. Thus if for example the number preset is negative, the A/S lead must be biassed to subtract each "positive" pulse — that is, each pulse which arrives to be added.

Suitable equipment to satisfy these requirements in the case of the embodiment of FIG. 1 will now be described with reference to FIG. 2, in which the components already mentioned are given their previous references. As before, positive AND logic will be assumed to simplify the description.

The bistable which controls the sign display in some convenient device 51 is indicated at 52. Its outputs are applied over lead S and R to control the bias on the A/S lead by way of two two-entry AND gates 53 and 54 the outputs from which are commoned at an OR gate 55. The circuit parameters are such that the A/S lead is already at a positive potential, at a comparatively high or comparatively low level — e.g. zero — depending on whether the incoming pulse is to be added or subtracted. Leads S and R are at comparatively high and comparatively low positive potentials respectively when stage 52 is in its Set state, and the reverse when it is in its Reset state.

The other inputs to gates 53 and 54 are provided over a line PS (pulse sense) which, as each pulse arrives, delivers a pulse-sense signal which is at a comparatively high or low potential depending on the sense (as above defined) of the pulse. When the incoming pulses are of uniform sense, the PS signal remains steadily high or steadily low, as appropriate, only changing state when the pulses do so. The connection to gate 54 is by way of a negater of state-reversing stage 56.

Stage 52 is only switched from one to the other of its stable states when a total zero count is passed through in either direction. For this purpose all the $n$ digit 0 outputs from the stages of the counter S are applied as the inputs to a detect-zero stage in the form of an $n$ entry AND gate 61 the output from which is applied by way of two two-entry AND gates 62 and 63 and OR gates 64 and 65 to the Set and Reset inputs of stage 52. The other inputs to gates 62 and 63 are derived from line PS, direct, or by way of a negater 66, respectively.

The operation of the equipment so far described will now be briefly indicated, taking to begin with the example considered above of a count down through zero from a positive number by a train of negative pulses.

To start with, stage 52 is in its Set state thereby causing leads S and R to have comparatively high and low potentials respectively, and causing the "+" sign to be displayed in device 51. The high output on lead S causes gate 53 to be alerted, whereas gate 54 is blocked by the low signal on lead R. As all the incoming pulses are negative, line PS delivers a steady low signal. This accordingly blocks gate 53 and, after reversal by negater 56, enables gate 54. Gate 54 however is blocked by the low output on lead R of bistable 52. With both gates 53 and 54 thus blocked no enabling signal is transmitted to OR gate 55; hence the A/S lead is brought to the low potential which biases the counter S to the subtract condition. As a result each pulse on arrival is subtracted. As stage 52 remains Set, the "+" sign remains displayed.

The signal on lead PS is alerting gate 63, by way of negater 66 rather than gate 62, just as it is alerting gate 54 rather than gate 53. But in the absence as yet of a signal from gate 61 this has no effect.

When, however, the all-zero state is reached, gate 61 delivers a signal, and this is passed through gates 63 and 65 to switch stage 52 to its Reset state.

Gates 53 and 55 and 63 and 65 and the interconnections between them and stage 52 constitute the logic network of gates above referred to.

As each subsequent pulse arrives for subtraction, the pulse-sense signal on lead PS continues to enable gate 54 which is enabled also by the potential on lead R to the A/S lead, but as stage 52 is now in its Reset state that potential is now at the higher level. OR gate 55, being actuated by the high output from gate 54, sets the A/S lead to its higher potential. Hence those pulses are now added, the Reset state of stage 52 causing device 51 to indicate that the count is now of the negative sense.

If, on the other hand, the first pulse to arrive after the zero count had been reached was for addition, the corresponding positive potential of lead PS would enable gates 62 and 53, thereby retaining stage 52 in its Set state so as fully to open gate 53 thus causing the A/S lead to have the high potential appropriate to addition. As stage 52 would remain Set, the "+" sign would remain displayed.

To enable the operator to indicate the sign of the number preset in counter S by way of counter A, the following extra equipment is needed to effect, by way of a part of the logic network of gates, the control of the A/S bias and the sign which stage 52 causes to be displayed.

An output from the digit stage of least significance of counter A is applied by way of a lead 67 and two two-entry AND gates 71 and 72 and OR gates 64 and 65 to the Set and Reset inputs of stage 52, the entry into gate 72 being by way of a reversing stage 73.

The other entry to each of gates 71 and 72 is derived in the form of a further signal from decoder 25 over a lead Ls located between lead Ln and what was previously L($n + 1$) but is now lead L($n + 2$). This signal is applied to gates 71 and 72 by way of a two-entry AND gate 74, the other entry to gate 74 being derived from trigger stage 21.

The operation of this additional equipment will now be described on the assumption that the plus and minus signs for display in stage 51 are represented by the digit 1 and digit 0 conditions of the least significant stage of counter A, by the high or low energisation of lead 67, and by the Set and Reset states of stage 52.

After the operator has keyed in the required BCD signals into each of the S stages requiring a number, he operates switch 14 (FIG. 1) in the B direction once more, thereby stepping the decoder 25 to energise lead Ls and so alert gate 74. This operation also resets counter A to all-zero.

Though lead Ls is now energised, it is blocked at gate 74; to remove this inhibition, switch 14 is moved to the A position. This has two results: first, gate 74 is unblocked, thereby allowing the signal on lead Ls to alert gates 71 and 72; second, and shortly afterwards, the lowest stage of counter A acquires digit 1. This last effect causes a positive signal to be applied by way of lead 67 and alerted gate 71 and gate 64 to switch stage 52 to its Set state (if not already in it) and so cause the "+" sign to to displayed.

If that is the required sign, the next operation is to displace switch 14 again to B, thereby stepping decoder 25 on to lead L($n + 2$) with the same resetting result described above with reference to the lead L($n + 1$) of FIG. 1.

If however, the required sign is a minus, the switch must be operated again in the A direction to step the lowest staged counter A to digit 0. Lead 67 now carries a low signal, which on reversal by negater 73 actuates gates 72 and 65 to switch stage 52 to its Reset state and produce the required display. It is important to note that switch 14 must not be moved in the B direction in between these two moves in the A direction, for it would de-energise lead Ls and so block both the gates 71 and 72.

To sum up: to produce a display of a positive signa, switch 14 should be moved first to B, and then to A, and then back to B to cause full resetting. Alternatively to display a minus sign, the switch should be moved first to B, then twice in succession to A and then finally to B.

If this arrangement for setting up a minus display, involving as it does the actuation of switch A twice in the same direction, is objected to, a simpler operation may be provided by including bistable 52 in the manual resetting system actuated over lead 42 of FIG. 1.

Thus as shown in broken lines in FIG. 2, the connection from gate 74 to gates 71 and 72 is made by way of an OR gate 75 having a connection from lead 42 as a second input.

In operation, the manual resetting of the system to enable gates 71 and 72, and by resetting counter A to zero applies a signal by way of lead 67 and inverter 73 to actuate gate 72 and so reset bistable 52 by way of OR gate 65. This resetting of stage 52 causes a minus sign to be displayed.

When the time comes to preset the sign and the desired sign happens to be a minus, it is thus already present. Hence no specific sign setting operation is needed.

If however, a plus sign is desired, switch A has to be actuated once in the B direction to select the sign stage; then once in the A direction to (a) unblock gate 74 and (b) advance counter A to digit 1 and so actuate stage 52 to cause the plus sign to be displayed.

Here the inhibiting control exerted on the Ls signal at gate 74 is needed because if it were not provided and the decoder were left energising that lead, gates 71 and 72 would remain alerted with the result that the signal on 67, which would always be present in one or other sense would cause undesirable operation of stage 52.

It was explained above by reference to FIG. 1 that the lead L($n + 1$) of that arrangement could be omitted, and a manual reset over lead 42 relied on to restore the equipment for the next presetting operation. The corresponding lead L($n + 2$) of the arrangement of FIG. 2 could similarly be omitted.

What we claim is:

1. A multi-stage binary-coded decimal counter which includes a plurality of counter stages each having four preset data input points capable of being energised in parallel binary fashion, a presetting counter having four output points connected to the corresponding four preset data input points of each of the counter stages and arranged to apply to all stages of the multi-stage counter binary signals representing a decimal digit in terms of the number held in the presetting counter at any instant, actuating means connected to the presetting counter for applying thereto a predetermined number of pulses, stage-selecting means connected to the stages of the multi-stage counter for selecting the stage to which the output of the presetting counter is to be applied, and inhibiting means including gating means connected to the stage-selecting means to prevent the latter means from selecting a stage of the multi-stage counter except while pulses are being applied to the presetting counter by the actuating means.

2. A counter as claimed in claim 1 in which both the actuating means and the stage-selecting means include the same two-way electric switch.

3. A counter as claimed in claim 1 in which the inhibiting means include pulse generating means responsive to the operation of the actuating means to generate pulses of longer duration than that produced by the actuating means.

4. A counter as claimed in claim 3 which includes further delay means responsive to the operation of the stage-selecting means to apply a reset signal to the presetting counter to restore it to a datum number.

5. A counter as claimed in claim 4 in which the said datum number is zero.

6. A counter as claimed in claim 1 which includes a control lead common to all stages of the multi-stage counter, a display device for displaying the sign of the counter held in the multi-stage counter, a bistable device operable to control the display device, a detect-zero stage responsive only when all stages of the multi-stage counter hold digit zero, and a logic network responsive to signals indicating the sense of each pulse to be counted and to the output of the detect-zero stage to control a bias level applied to the common control lead, and to the bistable stage.

7. A counter as claimed in claim 6 which includes means for deriving from the stage-selecting means a further signal after all stages of the multi-stage counter have been selected, and a connection from the presetting counter arranged to carry a signal indicating the sign of the count therein, the further signal and the sign-indicating signal being applied to the logic network to actuate the display device and bias the common control lead as appropriate.

8. A counter as claimed in claim 7 which includes means for inhibiting the application of the further signal to the logic network except during the application of the sign-indicating signal to the logic network.

* * * * *